United States Patent [19]

Mang et al.

[11] Patent Number: 4,834,659
[45] Date of Patent: May 30, 1989

[54] ADAPTOR IN APPARATUS FOR ELECTRONICALLY TESTING PRINTED CIRCUIT BOARDS

[75] Inventors: Paul Mang, Schmitten; Savvas Arampoglou, Bad Camberg, both of Fed. Rep. of Germany

[73] Assignee: Mania GmbH & Co., Weilrod, Fed. Rep. of Germany

[21] Appl. No.: 213,621

[22] Filed: Jun. 30, 1988

[30] Foreign Application Priority Data

Nov. 9, 1987 [EP] European Pat. Off. ............ 87116528

[51] Int. Cl.$^4$ ............................................. H01R 9/09
[52] U.S. Cl. ................................. 439/55; 324/158 F; 324/158 P
[58] Field of Search .......................... 439/55, 74, 75; 324/158 F, 158 P

[56] References Cited

U.S. PATENT DOCUMENTS 3,676,776  7/1972  Bauer et al. .................... 324/158 P
3,970,934  7/1976  Aysu ............................. 324/158 F
4,774,459  9/1988  Maelzer et al. ................ 324/158 F

FOREIGN PATENT DOCUMENTS 26824  4/1981  European Pat. Off. ........ 324/158 F
215146  3/1987  European Pat. Off. ........ 324/158 F Primary Examiner—Eugene F. Desmond
Assistant Examiner—Khiem Nguyen
Attorney, Agent, or Firm—Wenderoth, Lind & Ponack

[57] ABSTRACT

An adaptor for adapting the uniform contact element array in an electronic apparatus for testing printed circuit boards to the non-uniform distribution of connection points on a circuit board to be tested includes at least one adaptor plate having therethrough bores in accordance with the facing pattern of the connection points on the circuit board. A spacer of resilient construction forms a compressible spacing element equally suited for one- and two-sided testing of circuit boards. For two-sided testing, an outer adaptor plate, on which the circuit board is directly placed, is supported additionally, when needed, by supporting posts.

8 Claims, 4 Drawing Sheets

ADAPTOR IN APPARATUS FOR ELECTRONICALLY TESTING PRINTED CIRCUIT BOARDS

BACKGROUND OF THE INVENTION

The present invention relates to an adaptor for matching the uniform contact raster array in an apparatus for electronically testing printed circuit boards to the possibly non-uniform pattern of connection points on a printed circuit board to be tested.

A "univeral adaptor" as disclosed in EP-B1-26 824 comprises a platen overlying a basic raster array of a test apparatus and having there through passages or through-bores arranged in accordance with the aforesaid uniform contact raster array. At some distance above the basic raster array on the side of the platen facing away therefrom, there is provided an assembly of two adaptor plates held in a spaced relationship by means of stationary spacer elements. These adaptor plates are provided identically with bores arranged in accordance with the connection points on the circuit board to be tested. The bores in the adaptor plates receive needle-shaped and longitudinally resilient test pins the lower portions of which are resiliently deflectable in directions transverse to the longitudinal extent thereof to compensate for alignment errors between the aforesaid bores in the adaptor plates and passages in the platen. The adaptor also includes means for aligning the circuit board to be tested with the adaptor, such as suitable alignment pins engaging corresponding alignment bores in the circuit board under test. The two (inner and outer) adaptor plates have identical patterns of bores therethrough in accordance with the connection points on the circuit board to be tested and are held in a spaced relationship so that the portions of the test pins adjacent the printed circuit board are precisely vertical and perpendicular to the circuit board surface and accurately contact the connection points thereon even though the lower, more distant portions of the test pins may be deflected from vertical.

Complex circuit boards may have thousands of connection points thereon and a separate resilient test pin is needed for every one of them. As a consequence, expenses for an adaptor of this kind will rise disproportionately with the number of connection points as longitudinally resilient test points require a substantial manufacturing effort. In addition, test pins of this type have a minimum diameter which it is practically impossible to reduce further, so that there exists a natural limit to the test pin density which may be attained in a testing adaptor of the kind at issue.

In order to make possible the use of longitudinally rigid test pins which are easy to manufacture and particularly thin, there has been created an "active basic contact array" in which the contact elements of the basic raster array in the circuit board testing apparatus are substantially mounted for resilient movement in the direction of the longitudinal axis of the test pins. This active basic raster array is placed on the rigid hard-wired basic contact array in the printed circuit board testing apparatus and serves to make sure that the rigid test pins exert a contact pressure as uniform as possible and of sufficient magnitude on all the connection points they contact.

EP-A1-0 215 146 discloses an adaptor of this type ("Adaptor 85") including a top plate which has a pattern of bores therethrough in accordance with the circuit board to be tested and which engages the circuit board under test and wherein rigid uncontoured test pins extend through an additional plate made of an elastomeric material which prevents the pins from dropping out while the adaptor is being handled outside the testing apparatus proper. This makes it possible to save the substantial work required for providing an adaptor with its complement of test pins when testing a circuit board identical with one which has been tested some time in the past, since the adaptor may be shelved for re-use. The aforesaid adaptor is advantageous in that it makes possible the use of totally uncontoured rigid test pins. Providing it with its complement of test pins is made difficult, however, by the test pins being unable to simply "drop" into it, since some force must be applied to urge them through the elastomeric plate.

The adaptors discussed above were conceived for the one-side testing of printed circuit boards. A type of circuit board which is finding increasing use has connection points on both its major surfaces, however, so that they must be tested from both sides as well. It would be possible, of course, to test both sides individually one after the other. However, it would not be possible this way to detect conductor discontinuities as may occur in conductive connections between both sides of a circuit board, which connections moreover are particularly susceptible to opening. For this reason, the industry has developed circuit board testing apparatus capable of simultaneously testing both sides of double-sided printed circuit boards. This has lead to the necessity of providing adaptors for testing apparatus of this nature. Unfortunately, the adaptors developed in the past are suitable for simultaneous testing on both sides in exceptional cases only, for a non-uniform distribution of the connection points on the two sides of the circuit board may cause the many thousands of test pins to substantially warp and deform the board under test, which may cause additional or new faults in conductors or may even cause the circuit board to break, the latter particularly in the case of ceramic boards. Where a circuit board is tested on one side only, a non-uniform distribution or local concentrations of test pins cannot produce so harmful an effect since the supportive element engaging the opposite side of the circuit board under test may be a solid plate in the testing apparatus proper which will receive whatever forces are applied thereto non-uniformly without warping so that the circuit board under test will be supported in a condition substantially free from deformation. When a circuit board is tested on both sides at the same time, this manner of supporting it will not be practicable because there will exist no backing element on the respective other side of the circuit board under test in localized areas thereof where no test pins exert counter-pressure. At most, such backing element will have the form of a perforate adaptor plate of the other adaptor, which cannot be provided with any degree of rigidity, particularly since it often is made of acrylic or the like to facilitate the manual mounting of the test pins. In the past, therefore, the adaptors for the two sides of a double-sided circuit board testing machine were different, thus resulting in considerable additional expenditures.

SUMMARY OF THE INVENTION

It is the object of the present invention to provide an adaptor for circuit board testing apparatus that may be provided in a rapid and inexpensive manner as may be the prior adaptors for one-sided testing, but that may be used for both one- and two-sided testing, means that its fundamental structure is identical for use on either side and that it combines the advantages the prior adaptors exhibited individually.

This object is achieved in accordance with the present invention by the provision of an adaptor including a base platen having therethrough passages arranged in accordance with the pattern of contact elements in the circuit board testing apparatus and to engage or overlie a uniform contact element array thereof in a planar parallel relationship. At least one adaptor plate has therethrough bores aligned with the pattern of connection points on the particular circuit board to be tested and is to be engaged thereby. Spacer elements, disposed outside the connection point area and vertical relative to the base platen and to the adaptor plate, position the adaptor plate on the side of the base platen facing away from the contact element array in a plane parallel to and in spaced relationship to the base platen. Longitudinally rigid needle-like test pins each have a first end for engaging a respective contact element in the contact element array of the testing apparatus and a second end for contacting a respective connection point on the circuit board to be tested. The test pins extend through respective of the passages in the base platen and through respective of the bores in the adaptor plate. The spacer element is resilient in the direction of spacing between the adaptor plate and the base platen, thus making it possible for the adaptor to suitably test one side or simultaneously test both sides of the circuit board. The unitary construction of the adaptor (whether it is used for one side or two side testing) ensures that accessory equipment for assembling the adaptor, such as test pin setting devices, may be the same in either case.

The resilient spacer may be provided in a particularly inexpensive manner in the form of a substantially annular spring element, particularly if it is mass produced as an injection molded part made of plastics material.

For using the inventive adaptor for the simultaneous testing of both sides of a printed circuit board, it is necessary simply to make sure that the at least one adaptor plate, i.e., the adaptor plate engaging the circuit board under test, is provided with additional suitable supportive means in the areas of reduced test pin density relative to the test pin density on the other side of the circuit board under test in order to prevent flexing or warping of the outer adapter plate serving as a backing element for the circuit board where no test pins are present, in case no or few contact pins engage one side of the circuit board. In this way, the contact pressure exerted by a major number of contact pins on the other side of the printed circuit board may be balanced. Conceivably, such additional supportive means for the at least one adaptor plate may be present in various forms, such as beams or transverse bars extending underneath the outer adaptor plate and supported themselves outside the contact pin array. The presently preferred embodiment includes supportive means in the form of separate resilient supporting posts supporting the outer adaptor plate at the bottom thereof by extending in a substantially vertical direction through additional bores through the inner adaptor plate (if present) to the base platen placed on the test apparatus proper. Any load received by the outer adaptor plate will be transmitted to such separate resilient supporting posts. This means that where a small number of connection points in an area on one side of the printed circuit board requires too small a number of contact pins relative to the number of contact pins on the other side of the board, several supporting posts are added between the outer adapter plate and the adaptor base platen. Sufficient space will be available for such additional supporting posts in any event because they are needed only where the contact pins are few in number.

The supporting posts are longitudinally resilient. As a result, the counterpressure they built up will be proportional to the varying loading they experience due to the varying distances between the at least one (outer) adaptor plate and the base platen.

It may be most advantageous to provide between the at least one (outer) adaptor plate and the base platen an additional (inner) adaptor plate and to enlarge the cross section of the pins in the area between such inner and outer adaptor plates to a width greater than the diameter of the bores through these adaptor plates, such bores being provided in the pattern of the connection points of the circuit board to be tested. In this manner, the test pins cannot drop from the assembled adaptor when the latter is handled outside the testing apparatus.

BRIEF DESCRIPTION OF THE DRAWINGS

An embodiment of the present invention now will be described, with reference to the accompanying drawings, wherein.

DETAILED DESCRIPTION OF THE INVENTION

Figure 1:
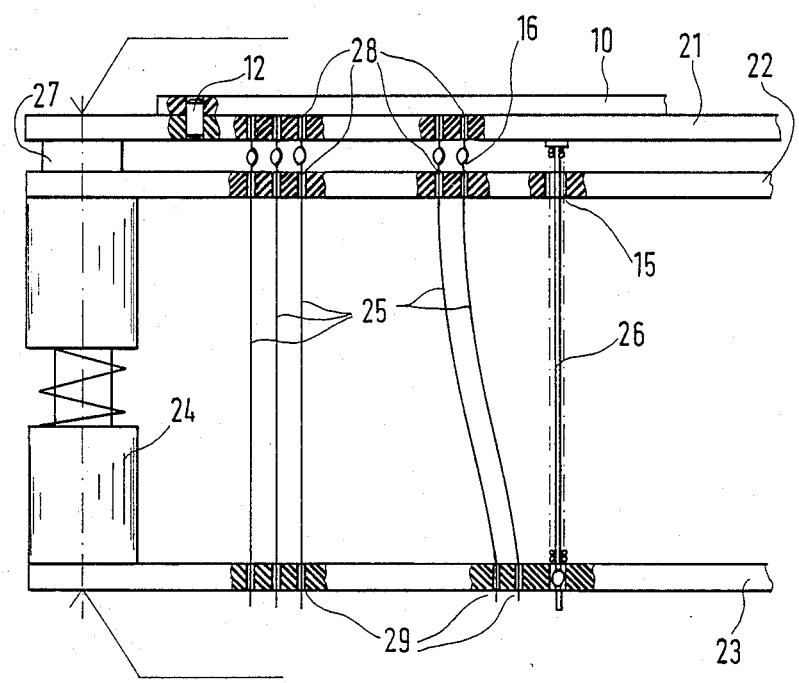
FIG. 1 is an elevation view, partially in section, showing the fundamental construction of an adaptor according to the invention.

The adaptor of the present invention includes at least two, and preferably three, plate members interconnected through resilient spacer elements and washers. In particular, a base platen 23 is connected through longitudinally resilient spacer 24 with an inner adaptor plate 22, which in turn is connected to an outer adaptor plate 21 via an intervening washer 27.

Adaptor plates 21,22 have bores 28 therethrough in the pattern of the connection points to be tested on a circuit board 10 under test (test specimen), i.e., the pattern of the bores through plates 21,22 is identical to the extent that the bores are provided for receiving test pins 25. Inner adaptor plate 22 (and 32 in FIG. 2, to be discussed below) must be provided with additional bores 15 for receiving supporting posts 26. The adaptor plates are made of electrically non-conductive material such as acrylic, epoxy, GFK board material, etc.. The lower-most base platen of the adaptor shown in FIG. 1 is provided in accordance with the pattern of the contact elements in the printed circuit board testing apparatus with basic array passages 29, as may be provided by drilling or the like. This means that base platen 23 has passages therethrough in a perfectly regular distribution in accordance with the pattern of the contact elements in the printed circuit board testing apparatus, while adaptor plates 21,22 have bores 28 therethrough which may be distributed in a non-regular pattern.

Figure 6:
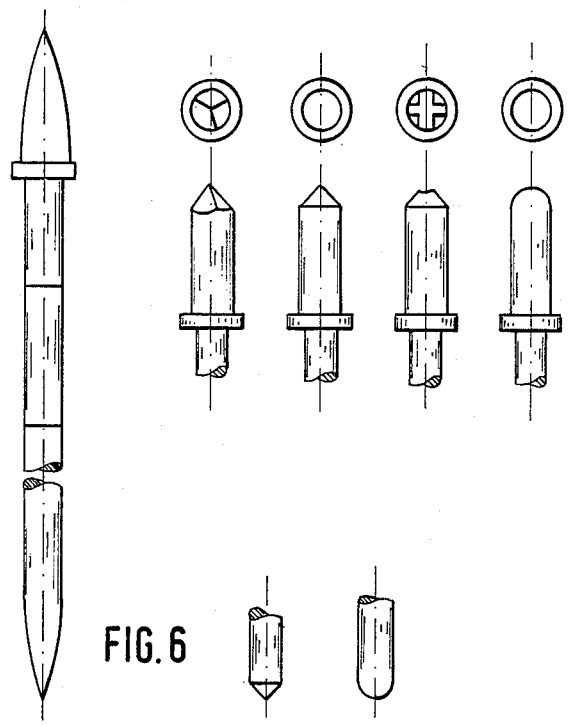
FIG. 6 shows in elevation various embodiment of contact pins suited for use with the adaptor of the present invention.

Between passages 29 in the base platen and bores 28 in the adaptor plates extend test pins 25 to make electrical contact between the contact elements in the test apparatus and the connection points of circuit board 10 under test. As shown in FIG. 1, part of these test pins may be flexibly deflectable in their lower portions adjacent base platen 23 so as to compensate for alignment errors between bores 28 in the adaptor plates and passages 29 in the base platen, or to provide for adaptation to locally increased connection point densities on circuit board 10 to be tested. To keep test pins 25 from dropping out of the adaptor of FIG. 1 while it is handled, each pin 25 has in the area between adaptor plates 21,22 an enlarged portion 16 having a width greater than the diameter of bores 28 in the adaptor plates. An enlarged portion of this kind may be provided on an otherwise smooth and uncontoured test pin in a simple manner by means such as crimping. Other possibilities are presented by way of the examples shown in FIG. 6.

Figure 4:
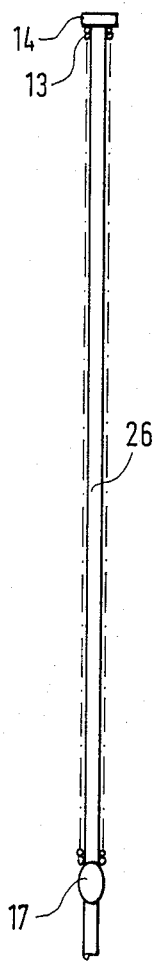
FIG. 4 is an elevation view of a supporting element in the form of a resilient post according to the invention.

When needed, additional supporting posts 26 are inserted between outer adaptor plate 21 and base platen 23 in areas of reduced test pin density. To this end, additional bores 15 are provided (on the basis of visual inspection or exact computation) for such supporting posts in portions of inner adaptor plate 22 where few bores 28 exist. Such additional bores 15 receive supporting posts 26, constructed in the manner shown in FIG. 4, after the adaptor of FIG. 1 has been assembled, but plate 21 has not yet been put in place. Supporting posts 26 each comprise a pin having a head 14 and a spring 13 wound around the shank of the pin. A cross-sectional deformation 17 may be provided at the lower end of the supporting post to retain compressive spring 13 thereon when the post is removed from the assembly. As shown in FIG. 1, head 14 of the supporting post engages the bottom surface (facing away from circuit board 10) of outer adaptor plate 21 while the bottom end of the support post as well as its deformed portion 17 are received by a bore or passage 29 in base platen 23. Spring 13 engages base platen 23 because its diameter is greater than the diameter of such bore or passage 29. In this manner, supporting posts 26 can accept excessive localized loads that may act on outer adapter plate 21 and transmit them to base platen 23 through springs 13. Platen 23 engages insulating blocks 41 of contact element array assembly 40 and is supported thereby (FIG. 2).

Outer adaptor plate 21 may have therein a positioning pin 12 cooperating with a matching positioning bore for alignment of circuit board 10 under test relative to test pins 25 or bores 28 (specific to the circuit board under test) in the adaptor plates. Thus, the positioning pin will center circuit board 10 under test relative to the adaptor so that the positions of the connection points on the circuit board will agree with the positions of the test pins in the adaptor.

The diameter of the bores (specific to the circuit board under test) in the adaptor plates is somewhat greater than the diameter of the rigid test pins used therefore (e.g., rigid pins: 0.8 mm, bores 28 in the adaptor plates: 0.85-0.9 mm).

Figure 2:
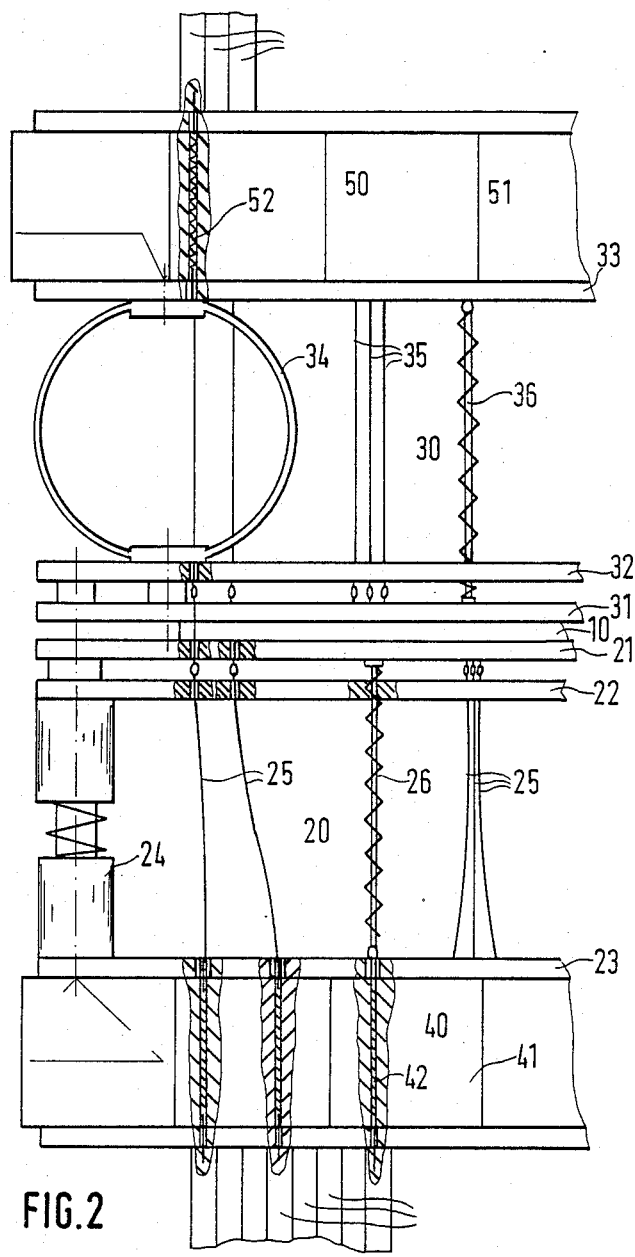
FIG. 2 is a view similar to FIG. 1, but showing the use of two adaptors, each constructed basically as shown in FIG. 1, for the two-sided testing of a printed circuit board in an electronic circuit board testing apparatus conceived therefor.

Along the edge of adaptor plates 21,22, i.e., outside the area having bores 28 therethrough, there are provided additional bores (not shown) to receive threaded fasteners for assembling plates 21,22 with washer 27 or spacer 24 (and 34 in FIG. 2). Similar assembly bores are provided in base platen 23.

As mentioned above, base platen 23 has therethrough bores or passages 29 in the pattern of the contact elements of the circuit board testing apparatus. The diameter of such bores or passages is selected to accommodate test pins 25 and supporting posts 26 having various diameters. In addition, the bores through base platen 23 should be countersunk, i.e., provided with a conical inlet opening to facilitate test pin placement into the adaptor. Also, base platen 23 and at least inner adaptor plate 22 should be constructed of transparent material so as to facilitate manual test pin placement and visual inspection for shorts between test pins 25 in the adaptor. Test pins 25 and, when used, suporting posts 26 are of course assembled with the adaptor with outer adaptor plate 21 removed. Once such assembly is finished, plate 21 is positioned and screwed down on spacer element 27 so as to secure the test pins and supporting posts in place.

Figure 3:
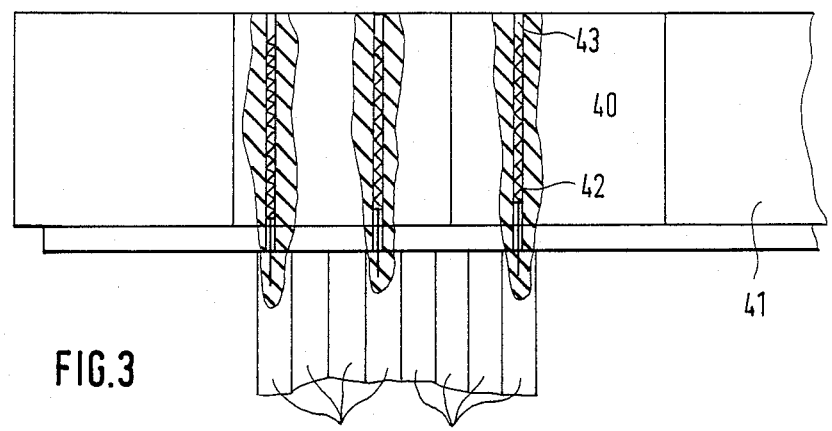
FIG. 3 is an enlarged elevation view, partially in section, showing the fundamental construction of a basic active contact array of the testing apparatus which is connected by the inventive adaptor to the circuit board under test.
Figure 5:
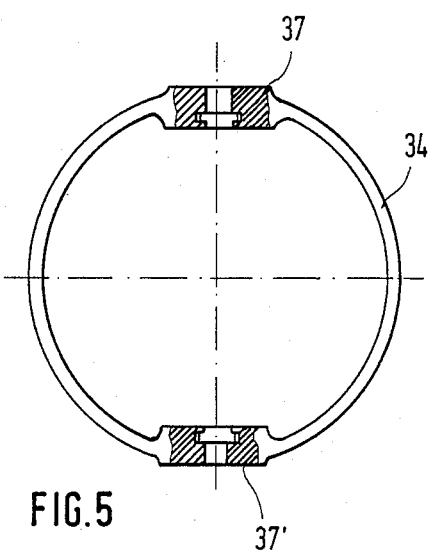
FIG. 5 is an elevation view, partially in section, of an embodiment of a resilient spacer between a base platen and two adaptor plates of the adaptor.

The two adaptor plates 21,22 are fixed in the proper mutual relationship by means of spacer element 27. The plates are positioned relative to base platen 23 by spacer 24 which in the embodiment shown in FIGS. 1 and 2 is resilient in its longitudinal direction. An alternative embodiment of a resilient spacer is shown in FIG. 2 at 34. As shown in more detail in FIG. 5, spacer 34 may comprise a section of suitably dimensioned conduit provided with assembly bores or a member injection-molded of a plastics material. The use of a resilient spacer element of this kind (e.g., in the form of an open or closed leaf spring) will keep adaptor cost low. As a circuit board under test is urged against the test pins, adaptor plates 21,22 (specific to the circuit board to be tested) move donwardly together with the rigid test pins shown in FIG. 1, with the downward axial displacement of test pins 25 being counteracted by resilient contact elements 42 (FIG. 3) of (active) basic contact array assembly 40 therebelow, while spacer 24 (or 34) is deformed to a corresponding extent, as is, ultimately, the compresive spring 13 on each supporting post 26.

FIG. 2 shows an adaptor assembly comprising two adaptors of the type shown in FIG. 1 for the two-sided testing of a circuit board 10. Apart from the alternative resilient spacers 24 and 34, the two adaptors are identically constructed. Adaptor 20 is used for contacting the bottom, and adaptor 30 for contacting the top of the circuit board under test. Lower adaptor 20 is placed on contact element array assembly 40 therebelow of the circuit board testing apparatus of which no further details are shown, with array assembly 40 being provided with resilient contact elements 42 inserted in bores 43 in a block 41 of insulating material and connected through plug-type connectors with the testing electronics in the circuit board testing apparatus proper. Thus, the resilient contact elements in the contact element array assembly are associated with the testing apparatus.

Upper adaptor 30 is attached to an upper contact array assembly 50 of the printed circuit board testing apparatus. The upper basic contact element array assembly 50 is constructed the same way as lower basic contact array assembly 40. Both assemblies 40,50 may be moved towards each other by suitable mechanical means (not shown), with the testing electronics following such movement so that the distance between the lower and upper contact array assemblies 40,50 decreases. Rigid test pins 25,35 of both adaptors 20,30 extend through respective passages in base platens 23,33 to enter respective bores in active basic contact array assemblies 40,50 so that resilient contact elements 42,52 will be compressed. At the same time, the distances between each base platen 23 and 33 and respective pairs of adaptor plates 21,22 and 31,32 will change as well, since the pairs of adaptor plates are held through resilient spacers such as 24 and 34.

Supporting posts 26,36 extend into the bores in the respective contact array assemblies 40,50 of the printed circuit board testing apparatus, with springs 13 of posts 26,36 being compressed. Test pins 25 of lower adaptor 20 urge circuit board 10 under test against outer adaptor plate 31 of upper adaptor 30 while plate 31 receives additional support by posts 36. In the same manner, test pins 35 of upper adaptor 30 urge circuit board 10 under test toward outer plate 21 of lower adaptor 20 while plate 21 in turn receives support by posts 26. As a result, circuit board 10 is held in a clamped manner between the outer adaptor plates 21,31 and will undergo deformation only in case these adaptor plates are deformed themselves, an occurrence preventing by supporting posts 26,36.

As a single compressive spring 13 on a supporting post 26,36 can compensate the force of engagement of several test pins, a relatively small number of supporting posts 26,36 is required in an adaptor. The number and the mutual spacing of the supporting posts depends on the number of test pins used for contacting both sides of the circuit board under test, and the supporting posts may be positioned on the basis of a visual estimate or of exact computations.

In case a circuit board under test is contacted on both sides, as shown in FIG. 2, an adaptor is used on each side thereof. Both adaptors may be aligned with each other by means of alignment pins (not shown). To this end, adaptor plates 31,32 are provided with alignment bores to cooperate with such pins outside the area thereof having the bores corresponding to the connection points of the circuit board under test.

An adaptor of the type shown and described above is assembled and mounted in a manner such that the base platen and the inner adaptor plate (specific to each circuit board to be tested) are mounted on the resilient spacer. Thereafter, the test pins are introduced through the bores in the inner adaptor plate. Where needed (e.g., in the case of high test point densities in localized areas of the circuit boards under test), the test pins may be laterally deflected by several millimeters. The test pins may be placed in the adaptor manually or by means of an automatic machine. Then, the outer adaptor plate is placed in position. If the two adaptor plates are transparent, visual inspection is possible of any contacts between test pins and the resultant shorts. Using the circuit board testing apparatus, the adaptor so assembled may then be tested for the number and locations of the test pins and the detection of shorts inside the adaptor.

Although the present invention has been described and illustrated with respect to preferred features thereof, various changes in the modifications may be made to the specifically described and illustrated features without departing from the scope of the present invention.

What is claimed is:

1. An adaptor for adapting a uniform contact element array in an apparatus for electronically testing printed circuit boards to a non-uniform pattern of connection points on a circuit board to be tested, said adaptor comprising:
   a base platen having therethrough passages arranged in accordance with a pattern of contact elements in the testing apparatus and to engage or overlie the contact element array in the testing apparatus in a planar parallel relationship;
   at least one adaptor plate having therethrough bores aligned with the opposite pattern of connection points on the circuit board to be tested and to be engaged thereby;
   spacer element means, to be disposed outside the connection point area and vertical relative to said base platen and to said at least one adaptor plate, for positioning said at least one adaptor plate on the side of said base platen facing away from the contact element array of the testing apparatus in a plane parallel to and in spaced relationship to said base platen;
   longitudinally rigid needle-like test pins each having a first end for engaging a respective contact element in the contact element array of the testing apparatus and a second end for contacting a respective connection point on the circuit board to be tested, said test pins extending through respective said passages in said base platen and through respective said bores in said adaptor plate; and
   said spacer element means being resilient in the direction determining said spacing between said adaptor plate and said base platen and thus rendering the adaptor suitable for the one- or simultaneous two-sided testing of the circuit boards.

2. An adaptor as claimed in claim 1, wherein said spacer element means comprises a substantially ring-shaped spring element having along the periphery thereof two planar attachment portions connected to said at least one adaptor plate and to said base platen and oriented perpendicular to the diameter of said ring-shaped spring element.

3. An adaptor as claimed in claim 2, wherein said ring-shaped spring element comprises a member injection-molded from a plastics material.

4. An adaptor as claimed in claim 1, further comprising, during the simultaneous two-sided testing of the printed circuit board, supporting means for supporting the side of said adaptor plate engaging the circuit board under test in areas of low density of said test pins and thereby for preventing the pressure of test pins acting on the other side of the circuit board from flexing or warping said adaptor plate.

5. An adaptor as claimed in claim 4, wherein said supporting means comprise longitudinally resilient supporting posts engaging said adaptor plate and extending substantially perpendicular thereto and to said base platen and transmitting thereto any loads acting on said adaptor plate.

6. An adaptor as claimed in claim 4, further comprising a second adaptor plate disposed between said at least one adaptor plate and said base platen at a fixed distance thereto relative to said at least one adaptor plate, and wherein said test pins include, in the area between said adaptor plates, means for fixing their position in the longitudinal direction.

7. An adaptor as claimed in claim 6, wherein said means comprise broadened cross section portions of said test pins of a width greater than the diameter of the test pin-receiving bores in said adaptor plates.

8. An adaptor as claimed in claim 6, wherein the first-mentioned said adaptor plate is removable for positioning said test pins into said adaptor.

* * * * *